US006503573B1

(12) United States Patent
Horwitz et al.

(10) Patent No.: US 6,503,573 B1
(45) Date of Patent: Jan. 7, 2003

(54) BOMB ANNEALING OF THIN FILMS

(75) Inventors: James Horwitz, Fairfax, VA (US); Douglas B. Chrisey, Bowie, MD (US); Adriaan Carter, Cabin John, MD (US); Manfred Kahn, Alexandria, VA (US); Jeffrey M. Pond, Woodbridge, VA (US); Steven W. Kirchoefer, Bowie, MD (US); Wontae Chang, Reston, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/401,972

(22) Filed: Sep. 23, 1999

Related U.S. Application Data

(60) Provisional application No. 60/102,094, filed on Sep. 29, 1998.

(51) Int. Cl.$^7$ ............... B05D 3/02; B05D 3/04
(52) U.S. Cl. ............ 427/444; 427/376.2; 427/376.4; 427/377; 427/126.3
(58) Field of Search ............ 427/126.3, 376.2, 427/376.4, 377, 444; 428/411.1, 543

(56) References Cited

U.S. PATENT DOCUMENTS

| 2,388,611 A | 11/1945 | Hess ............... 117/125 |
| 3,279,947 A | 10/1966 | Kaiser ............ 117/217 |

(List continued on next page.)

OTHER PUBLICATIONS

Carter et al., "Pulsed Laser Deposition of Ferroelectric Thin Films For Room Temperature Active Microwave Electronics," Integrated Ferroelectrics, vol. 17, pp. 273–285, Sep. 1997.

Knauss et al., "The Effect of Annealing on the Structure and Dielectric Properties of $Ba_x Sr_{(1-x)} TiO_3$ Ferroelectric Thin Films," *Appl. Phys. Lett.*, vol. 69(1), pp. 25–27 (Jul. 1, 1996).

Varadan et al., "Ceramic Phase Shifters for Electronically Steerable Antenna Systems," *Microwave Journal*, pp. 116–127 (Jan., 1992).

Horowitz et al., "$Ba_xSr_{(1-x)}TiO_3$ Thin Films for Active Microwave Device Applications," *Integrated Ferroelectrics*, vol. 8, 53 (1995).

Carter et al., "Pulsed Laser Deposition of Ferroelectric Thin films for Room Temperature Active Microwave Electronics," *Integrated Ferroelectrics*, vol. 17, pp. 273–285 (Sep. 30, 1997).

Horwitz et al, "Structure/Property Relationships in Pulsed Laser Deposited Ferroelectric Thin Films for Frequency Agile Microwave Electronics," *SPIE*, vol. 3274, pp. 278–284 (Jun. 4, 1998).

*Primary Examiner*—Michael Barr
(74) *Attorney, Agent, or Firm*—John J. Karasek; Rebecca L. Forman

(57) ABSTRACT

A multicomponent film on a substrate can be annealed at higher temperatures in oxygen by using a specifically designed annealing vessel. The vessel is formed of a multicomponent material which has at least all of the components of the first multicomponent material of the film or, in the case where there are nonvolatile components, then the vessel is formed of a second multicomponent material which has at least the same composition of relatively volatile components as the first multicomponent film. As the multicomponent film is annealed for a sufficient time within the vessel the multicomponent film remains in contact with a vapor of the first multicomponent material and the vessel material. This process called bomb annealing prevents loss of volatile components from the film and roughening of the film surface and leads to films with lower dielectric loss. Preferred thin film materials are ferroelectric materials although any material could be used. The annealing can be done in oxygen at temperatures higher than 900° C.

34 Claims, 5 Drawing Sheets

U.S. PATENT DOCUMENTS

| | | | |
|---|---|---|---|
| 5,306,698 A | 4/1994 | Ahn et al. | 505/475 |
| 5,310,990 A | 5/1994 | Russell et al. | 219/121.69 |
| 5,328,718 A | 7/1994 | Abe et al. | 427/126.3 |
| 5,372,859 A | 12/1994 | Thakoor | 427/551 |
| 5,472,935 A | 12/1995 | Yandrofski et al. | 505/210 |
| 5,518,952 A | 5/1996 | Vonasek et al. | 437/82 |
| 5,620,739 A | 4/1997 | Azuma et al. | 427/79 |
| 5,817,170 A | 10/1998 | Desu et al. | 117/2 |
| 5,863,602 A | 1/1999 | Watanabe et al. | 427/237 |

BOMB ANNEALING OF THIN FILMS

CROSS REFERENCE TO RELATED APPLICATION

This application claims priority to Provisional Patent Application Ser. No. No. 60/102,094, filed Sep. 29, 1998, the entire contents of which are incorporated herein by reference.

BACKGROUND OF THE INVENTION

1. Field of the Invention

This invention relates to a process for annealing thin films, wherein the annealing is performed in a ceramic case ("bomb" or chamber) having the same chemical composition as the particular film itself.

2. Description of the Previously Published Art

Knauss et al., "The Effect of Annealing on the Structure and Dielectric Properties of $Ba_x Sr_{(1-x)} TiO_3$ (BST) Ferroelectric Thin Films," *Appl. Phys. Lett.*, vol. 69(1), pp. 25–27 (Jul. 1, 1996) relates to post-deposition annealing of SBT performed at 900° C. for eight hours. The entire contents of this article are incorporated herein by reference. There is no teaching as to the use of any enclosed annealing chamber.

Varadan et al., "Ceramic Phase Shifters for Electronically Steerable Antenna Systems," *Microwave Journal*, pp. 116–127 (January, 1992) relates to the use of the materials to develop a new class of tunable microwave devices. It describes the important issue of finding ways to reduce the dielectric loss. This article is only about bulk material, however, and it does not relate to thin films. It shows that ferroelectric phase shifters for electronically steerable antenna systems can be realized by using an appropriate composition (e.g., $Ba_{0.45}Sr_{0.55}TiO_3$) of barium strontium titanate material in a suitable transmission line medium (waveguide, coaxial line, or microstrip line). Ferroelectric phase shifters will have several advantages over other types of phase shifters, including high power handling capacity, simple driver circuitry, low drive power, and low cost, because of the large variation (more than 50%) of dielectric constant with DC biasing voltage.

Horwitz et al., "$Ba_x Sr_{(1-x)} TiO_3$ Thin Films for Active Microwave Device Applications," *Integrated Ferroelectrics*, vol. 8, 53 (1995) relates to the variation in thin film properties as a function of composition (i.e., ratio of Ba/Sr). There is no discussion about annealing. The dielectric constant, loss tangent and Curie temperature for $Sr_x Ba_{(1-x)} TiO_3$ (SBT) thin films with x=0.2–0.8 have been investigated at microwave frequencies. SBT films (0.5–3 $\mu m$ thick) were grown on (100) MgO and $LaAlO_3$ substrates by pulsed laser deposition at substrate temperatures from 850–900° C. in 0.35 Torr of oxygen. Deposited ferroelectric films were single phase, highly oriented, and characterized by X-ray rocking curve widths of $\leq 0.5$ degrees. Highly oriented SBT films with X-ray rocking curve widths of 72 arc seconds were observed. In general, the thin film dielectric constant at microwave frequencies is low (200–950) compared to the reported bulk value, but strongly dependent on the Sr/Ba ratio. Biasing of a ferroelectric interdigital capacitor (<200 kV/cm) produces a change in the dielectric constant which resulted in a phase shift in the reflected signal ($S_{11}$) measured as a function of frequency from 100 MHz to 10 GHz. The dielectric loss tangent measurement, as measured at room temperature and 9.2 GHz, ranges from 0.1 to $1.2 \times 10^{-3}$ and depends on the Sr/Ba ratio. These data show that SBT thin films are suitable for the development of frequency tunable microwave circuits and components.

3. Objects of the Invention

It is an object of this invention to provide an improved method of annealing thin films on a substrate so that the properties of the film are closer to those of a single crystal of that thin film material.

It is a further object of this invention to provide a method of annealing a multicomponent film on a substrate such that during the annealing the multicomponent film does not loose any of its components.

It is a further object of this invention to provide a method of annealing a $Ba_x Sr_{(1-x)} TiO_3$ (BST) film on a substrate at temperatures greater than 900° C.

It is a further object of this invention to provide a method of annealing a multicomponent film on a substrate in which the film is annealed in a "bomb" or chamber which is made of a material having at least all of the relatively volatile components of multicomponent material of the film.

These and further objects of the invention will become apparent as the description of the invention proceeds.

SUMMARY OF THE INVENTION

An improved method has been developed for annealing a multicomponent film on a substrate. The substrate with the multicomponent film thereon is enclosed within a vessel. The multicomponent film is formed of a first multicomponent material and the vessel is formed of a second multicomponent material which has at least all of the components of the first multicomponent material or in the case where there are nonvolatile components, then the vessel is formed of a second multicomponent material which has at least the same composition of relatively volatile components as the first multicomponent film. The multicomponent film is annealed within the vessel for a time sufficient to anneal the multicomponent film. During this annealing the multicomponent film remains in contact with a vapor of the first multicomponent material and the second multicomponent material and this resulting vapor prevents the multicomponent film from losing components of its first multicomponent composition during the annealing. This process prevents any compositional change in the film and it provides for improved dielectric behavior of the thin film. Preferred thin film materials are ferroelectric materials. However, the invention need not be limited to a method of treating ferroelectric thin films. The invention, in its broadest sense, relates to a method of treating a thin film of any material on a substrate by bomb annealing.

DESCRIPTION OF THE PREFERRED EMBODIMENTS

Figure 1A:
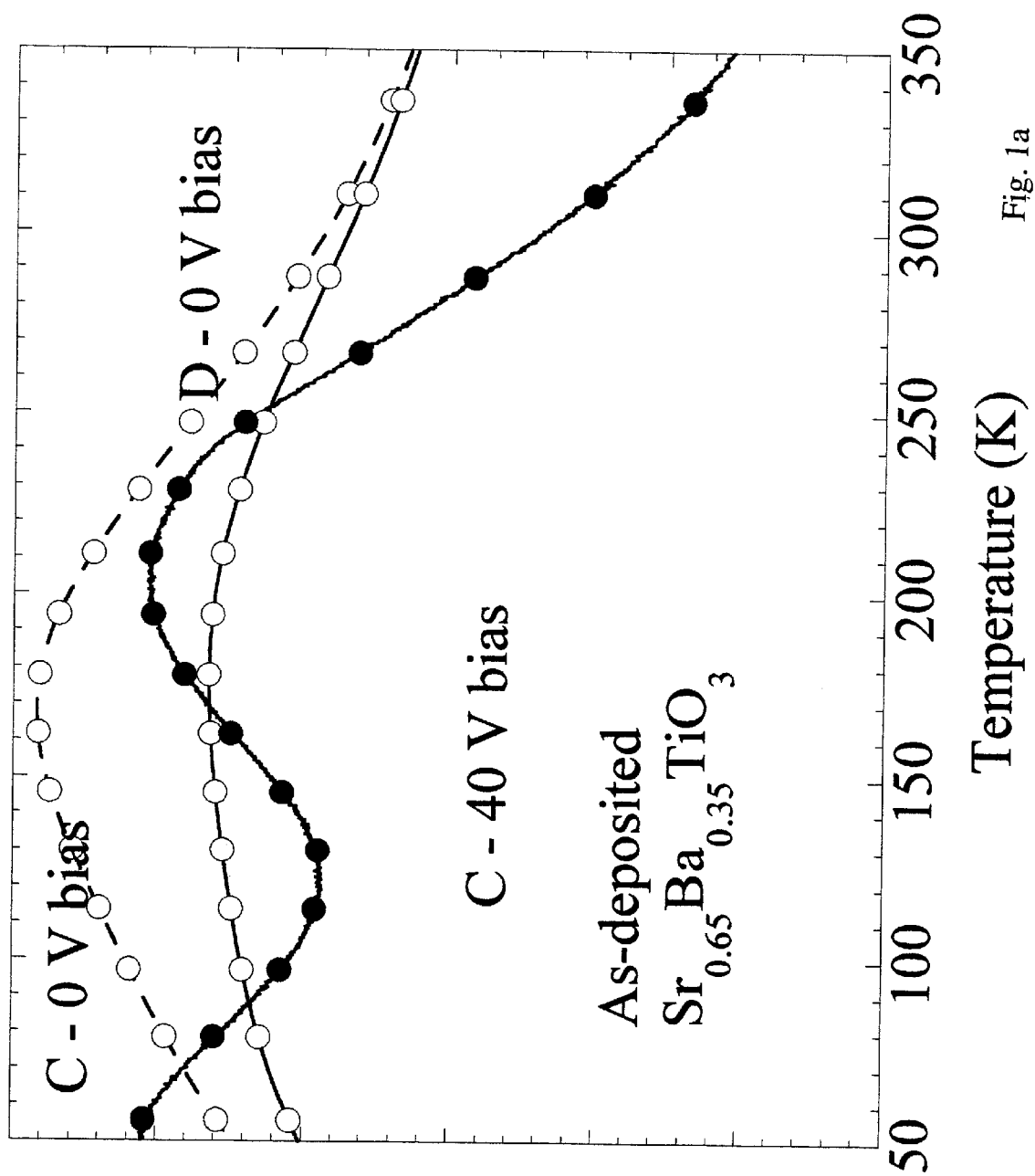
FIG. 1 illustrates in part 1a the temperature dependence and electric field dependence of the capacitance for a capacitor fabricated from an un-annealed ferroelectric film and in part 1b a comparison for a thin film $Sr_{0.5}Ba_{0.5}TiO_3$ to the bulk $Sr_{0.7}Ba_{0.3}TiO_3$.

Typical data for the behavior for the temperature dependence and electric field dependence of the capacitance for a capacitor fabricated from an un-annealed ferroelectric film at measured 1 MHz is shown in FIG. 1a where C is the capacitance and D is the dissipation factor of a capacitor based on the dielectric material. The capacitance is directly proportional to the dielectric constant of the material.

The results are qualitatively similar for a broad range of ratios of Sr/Ba. The temperature dependence of the capacitance is directly proportional to the temperature dependence of the dielectric constant. The as-deposited film shows a large electric field effect. A 40 V bias causes the capacitance at its peak to decrease by a factor of two (i.e., the films exhibits 25% tunability) where % tunability is the fractional change in the dielectric constant under the influence of a DC electric field represented by the formula:

$$\frac{C(0 \text{ volts}) - C(> 0 \text{ volts})}{C(0 \text{ volts})}$$

The maximum in the temperature dependence of the dielectric loss (dissipation factor) for the film is also shown in FIG. 1a. It has a maximum at a temperature that is higher than the Curie temperature of the film ($T_c$ is the temperature at which the dielectric constant exhibits a maximum). This is in sharp contrast to what is observed in the bulk material, as shown in FIG. 1b.

Figure 1B:
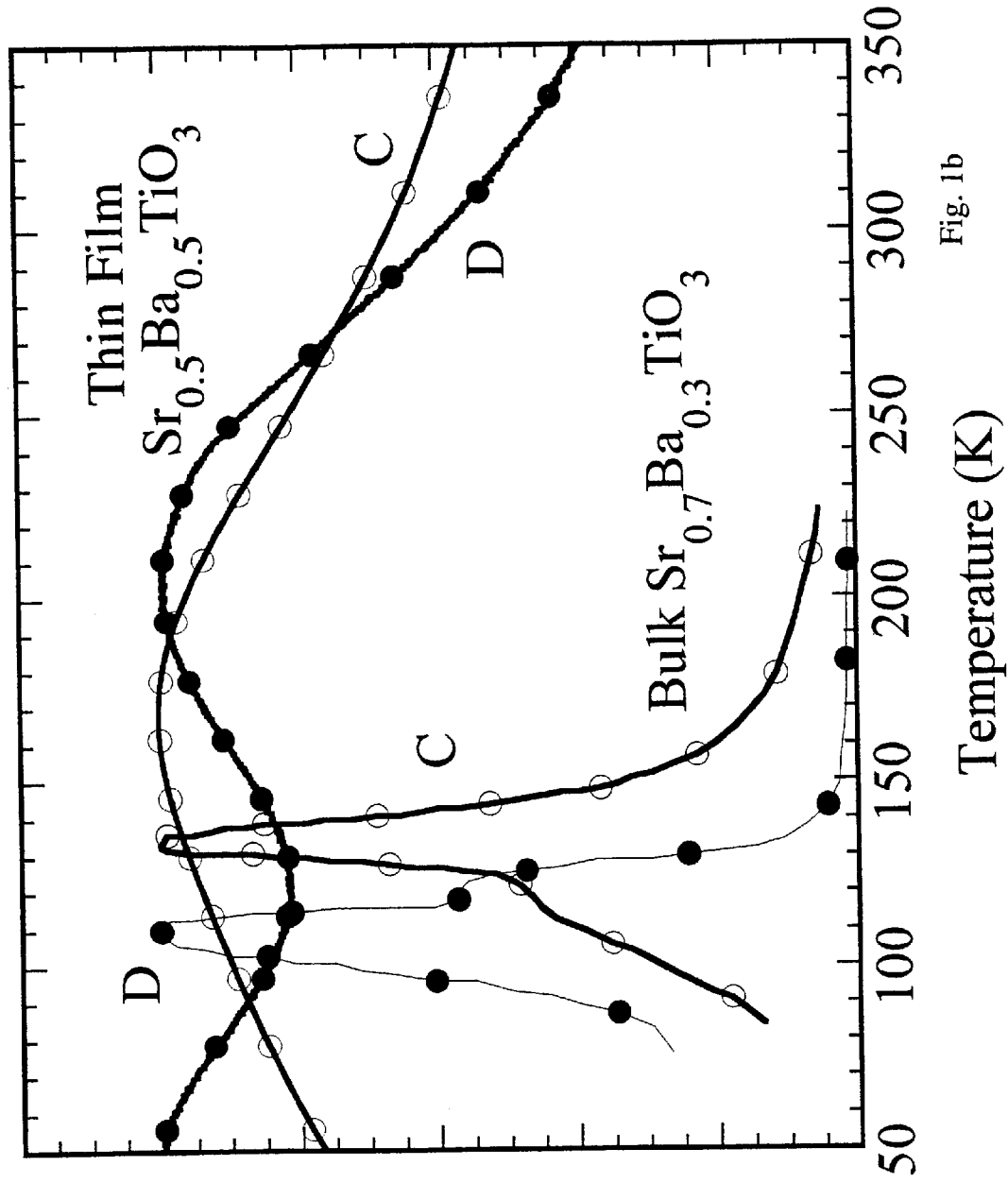

FIG. 1b illustrates a comparison for a thin film $Sr_{0.5}Ba_{0.5}TiO_3$ to the bulk $Sr_{0.7}Ba_{0.3}TiO_3$ where C and D are as described previously as measures at 1 MHz. Both the dielectric constant and the dielectric loss exhibit a sharply peaked temperature dependent behavior in the bulk material as seen on the left side of the graph. For the dielectric loss, in the bulk material, the peak is shifted to a much lower temperature than the peak in the dielectric constant. The broad temperature dependence of the dielectric properties of the film make the material desirable for device applications since the device properties would be relatively insensitive to the operating temperature. However, the high dielectric loss observed in the film at temperatures where the dielectric constant is high (and therefore the tunability is high) make the as-deposited thin film material unsuitable for device applications.

The Curie temperature ($T_c$) corresponds to a temperature at which a phase transition in the material takes place. For this material, as it is cooled from high to low temperatures, the material goes from a paraelectric to a ferroelectric phase. In the paraelectric phase of BST, the material has a cubic crystal structure. In the ferroelectric phase, it has a tetragonal structure. In the paraelectric phase, the material is polarizable in an electric field, however, when the field is turned off, the material does not have any memory of that field. In the ferroelectric state, the material is polarized by an electric filed, and remains partially polarized after the field is turned off. The polarized regions are called domains, and usually aligned themselves opposite to each other to minimize the energy of interaction. The Curie temperature of the film is the temperature at which the capacitance curve peaks. In general, it is observed that the Curie temperature of a thin film is reduced compared to what is reported in the literature for the bulk material with the same composition. Unlike the bulk material, the temperature dependence of the dissipation factor has a maximum near or above the thin film Curie temperature.

There are several reasons why the $T_c$ of the films is not the same as the bulk. These are primarily, oxygen vacancies, strain and changes in the Ba/Sr ratio between the target and the film. The strain and the oxygen vacancies tend to depress the $T_c$. The change in composition can make it go up or down. The films in the present invention are preferably annealed in oxygen to fill oxygen vacancies and reduce strain, and this is why the annealed films look more like the bulk than the as-deposited films. In general, most materials do not reproduce the bulk behavior in thin films.

The loss tangent for the deposited film has been measured at 1–20 GHz. As deposited $Ba_x Sr_{(1-x)}TiO_3$ films are characterized with values for tanδ that are ~0.01–0.05 as compared to $\leq 1 \times 10^{-4}$ for $SrTiO_3$ single crystals as reported in the literature. The goal is to obtain dielectric loss in the thin films that is similar to the dielectric loss in single crystals. A large field dependence is observed in the thin film with the capacitance being reduced by more than a factor of 2 for fields of ~80 kV/cm as compared to the 0 kV/cm field.

The differences between the thin film and bulk behavior are likely due to several factors. As-deposited films exhibit a significant non-uniform strain as discussed by L. A. Knauss et al, "The Effect of Annealing on the Structural and Dielectric Properties of $Ba_x Sr_{(1-x)}TiO_3$ Ferroelectric Thin Films" *Appl. Phys. Lett.*, 69 25 (1996). The calculated strain as determined from the broadening of x-ray diffraction peaks is ~0.1% as measured by L. A. Knauss et al. This is very large for a ceramic material and it likely has two contributions: the lattice mismatch between the film and the substrate, and the cation and anion vacancies. As-deposited films are very fine grained. Measured grain sizes are approximately 500angstroms for as-deposited films. To reduce the dielectric loss, the strain must be reduced and the average grain size must be increased.

Oxygen (anion) vacancies are present as films are deposited in a relatively low partial pressure of oxygen of about 300 mTorr. To fill the oxygen vacancies, pulsed laser deposition (PLD) thin films have been post-annealed in flowing oxygen at temperatures from 900° C. to 1,350° C. as described Carter et al., "Pulsed Laser Deposition of Ferroelectric Thin films for Room Temperature Active Microwave Electronics," *Integrated Ferroelectrics*, vol.17, pp. 273–285 (Sep. 30, 1997). The entire contents of this article are incorporated herein by reference.

Figure 2:
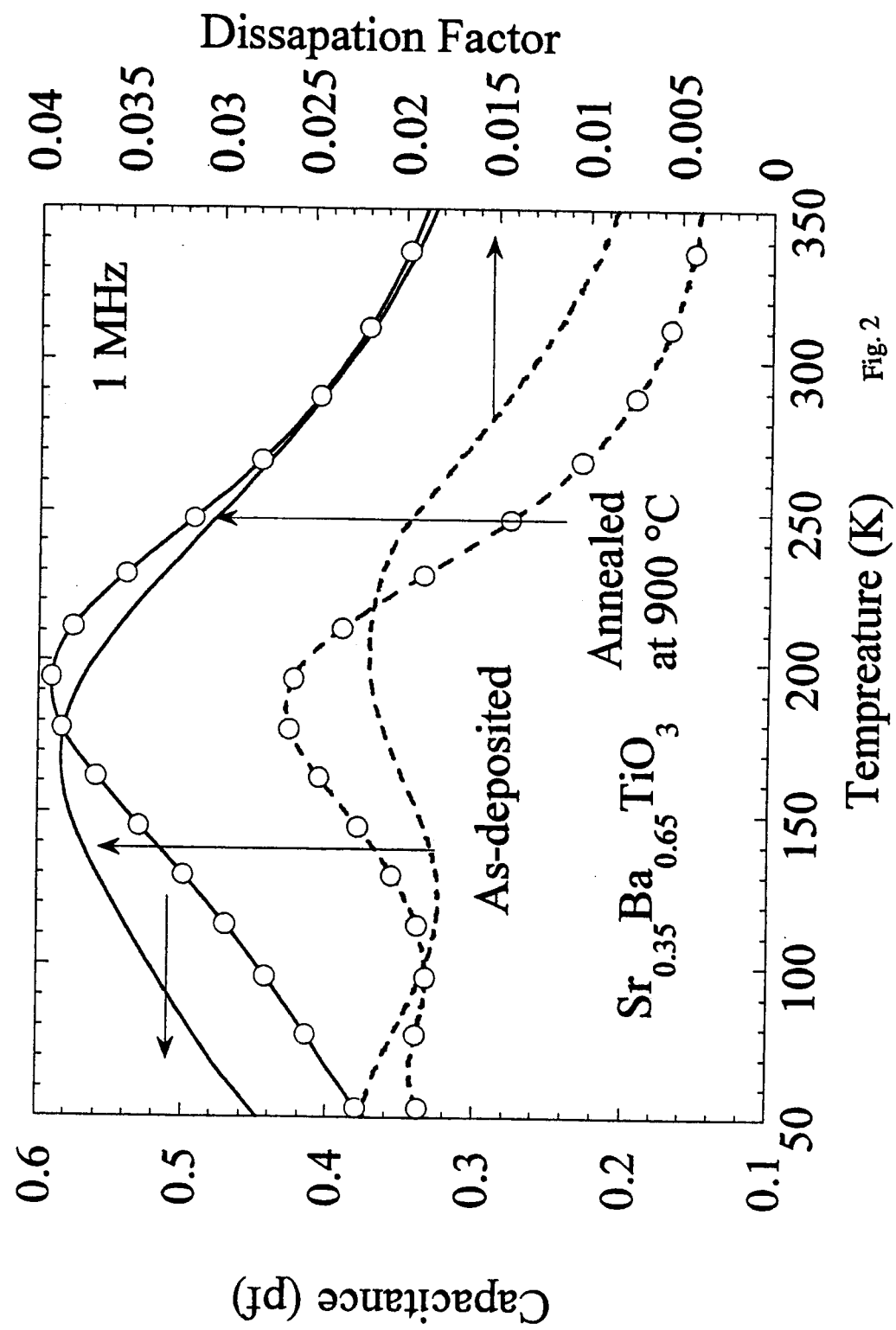
FIG. 2 illustrates a comparison of the capacitance and dissipation factor as a function of temperature for the as-deposited and 900° C. annealed films of $Sr_{0.65}Ba_{0.35}TiO_3$.

Significant improved changes in the structure and dielectric properties of ferroelectric films following a post-deposition anneal have been observed. X-ray diffraction of the post-annealed films indicates a decrease in the lattice parameter, presumably due to in filling of the oxygen vacancies, which results in a decrease in non-uniform strain. A comparison of the capacitance and dissipation factor as a function of temperature for the as-deposited and 900° C. annealed films of $Sr_{0.65} Ba_{0.35}TiO_3$ is shown in FIG. 2.

The influence of the post-deposition anneal can be seen clearly in several aspects of the data. First, in the capacitance data, there is a narrowing of the temperature dependence. The as-deposited curve is a broad curve extending over a wide temperature range from either side of the peak value. The post-deposition anneal shows a narrow curve falling off much faster. This narrowing of the temperature dependence of the dielectric constant is advantageous since it indicates more bulk like behavior in the annealed film. Second, there is a shift in the Curie temperature of the film which is the temperature at which the capacitance curve peaks. The shift to the right in the graph indicates that for a given temperature the capacitance level will be higher which in turn means the dielectric constant will be advantageously higher. As-deposited the $T_c$ is about 160 K which is increased to about 195 K, but is still below the bulk value of ~200 K as reported by L. A. Knauss et al infra.

As-deposited BST films show mirror like smoothness to the eye Grain size ranged from 250 to 500 angstroms depending on the deposition temperature and substrate. After annealing at 900° C. for 8 hours, the films were smoother, but the surface topology still suggests grain boundaries underneath. Annealing films for longer periods of time at 900° C. does not result in a further reduction in the dielectric loss.

At higher temperatures than 900° C. the environment that the films experience while being annealed becomes important. BST films showed surface degradation at temperatures above 900° C. in flowing $O_2$. The films became cloudy to the eye and showed what appeared to be erosion at the grain boundaries, revealing a 20 fold increase in grain size from the as-deposited films. The surface becomes rough due to a process called "grain boundary grooving" where large grains are growing and this is seen in the very clear grain boundaries. The problem with this rough surface is that subsequent photolithography can not be done on a rough surface and thus the rough surface is unusable for a thin film device. By using a "bomb" according to the present invention the partial pressure of the film's elements in the vapor surrounding the film is increased to completely stop the undesired roughening. This allows annealing temperatures of 1,250° C. for BST while the films maintained a smooth surface that revealed no grain boundaries. Similar improvements in film morphology can be seen for other oxide thin film materials such as $La_{0.67}Ca_{0.33}MnO_\delta$ (LCMO) thin films. Experiments with this material has shown the same annealing at 1000° C. in oxygen and the rough surfaces produced. Experiments with this material have further shown the same annealing at 1000° C. in oxygen with a smooth surface when the annealing is encapsulated. Further improvements in annealing can be achieved with other materials and especially where surface energy has an affect on morphology. The advantage of having a smooth surface energy is that when devices are fabricated electrodes need to be attached to the surface and the smoother the surface the better will be the bond. Also the smooth surface permits photolithography to add further components. Bomb annealing, although appearing to be a simple technique, results in significantly improved properties.

Figure 3:
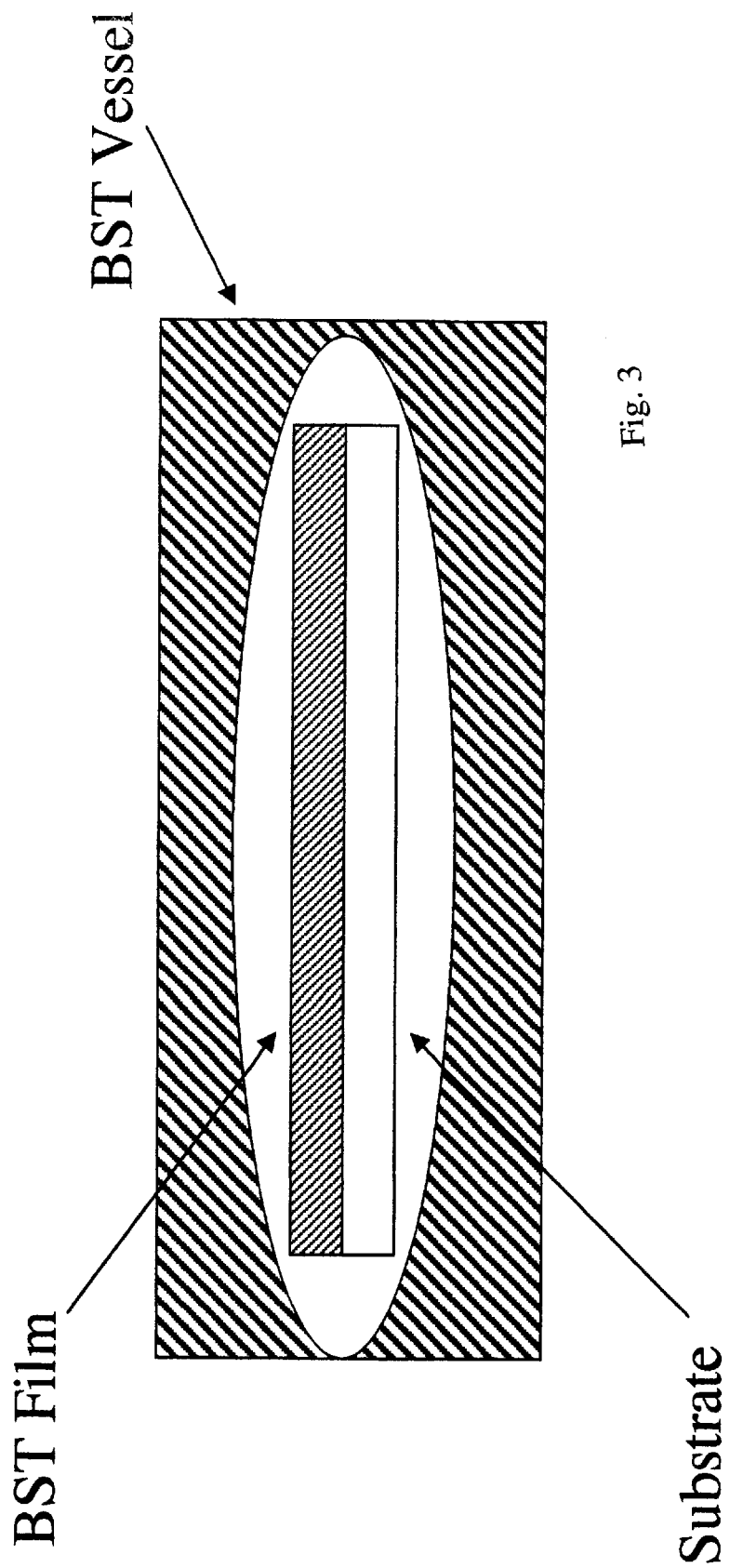
FIG. 3 illustrates the construction of an annealing bomb.

To carry out the annealing a ceramic case with the same chemical composition as the desired film, or at least the same composition of relatively volatile components as the desired film itself, is prepared. A hole is machined in the center of the ceramic as illustrated in FIG. 3 and an optional preferred Pt foil can be wrapped around the ceramic case. Other inert materials can be used for the foil wrapper.

When the film/bomb is heated to the desired temperature, the equilibrium vapor pressure of the bomb is the same as the film and it prevents any compositional change in the film. Using a bomb, the anneal temperature can be raised to a much higher value which results in further improvements of the dielectric loss. Films which have been bomb annealed at 1180° C. show improvements of the dielectric behavior at 1 MHz.

Figure 4:
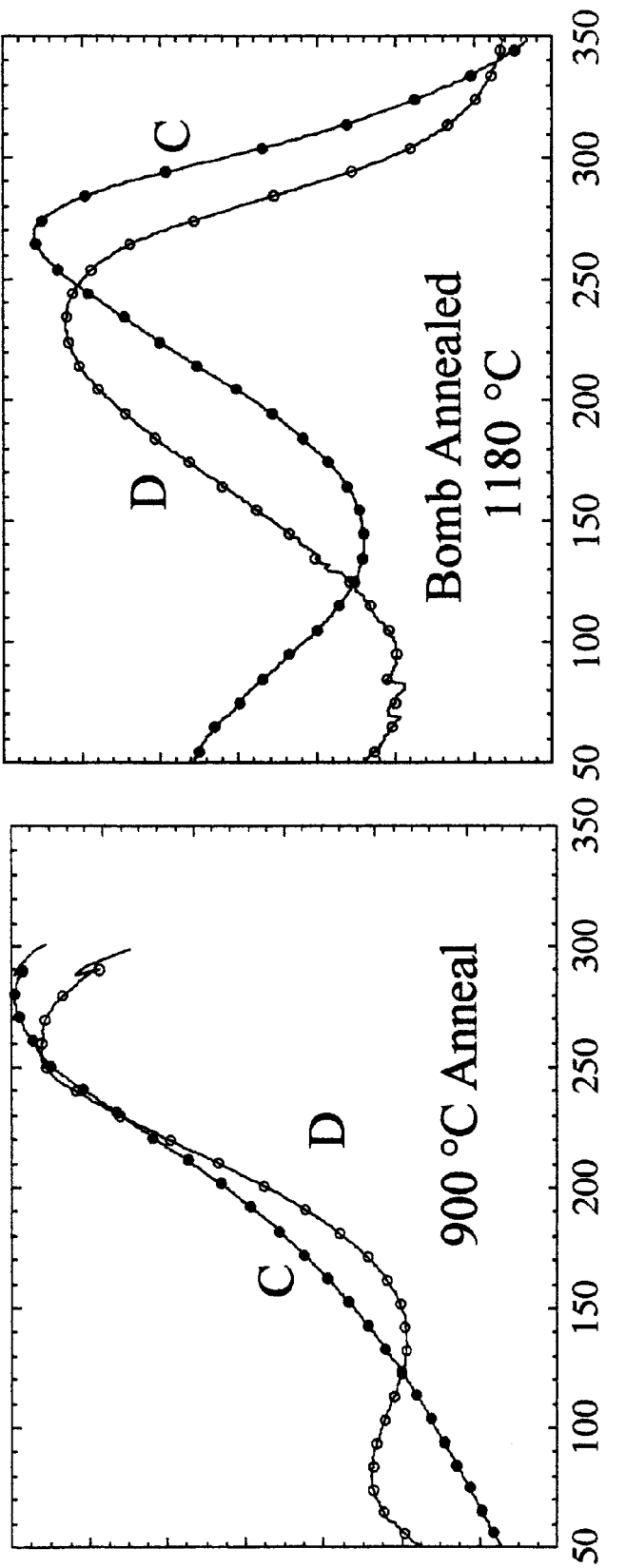
FIG. 4 illustrates the temperature dependence of the capacitance and dissipation factor for a $Ba_x Sr_{(1-x)} TiO_3$ (x=0.5) bomb annealed at 1180° C. for 2 hours in flowing oxygen as compared to a 900° C. anneal in oxygen.

FIG. 4 illustrates the temperature dependence of the capacitance (C) and dissipation factor (D) where C and D are as previously described as measured at 1 MH for a $Ba_xSr_{(1-x)}TiO_3$ (x=0.5) annealed at 1180° C. for 2 hours in flowing oxygen where the bomb is not sealed as compared to a 900° C. anneal.

The data show a clear improvement in the dielectric properties of the ferroelectric thin film for the tunable microwave applications. The temperature dependence of the dissipation factor becomes narrower as the annealing temperature is increased from 900° C. (in flowing oxygen) to 1180° C. (in the ceramic bomb and in flowing oxygen). In addition, the peak in the temperature dependence of the loss shifts to a lower temperature. As the loss peak and the capacitance peak ($T_c$) become separated, the dielectric constant for temperatures above $T_c$ remains relatively high while the dielectric loss is significantly reduced. In this temperature range (paraelectric phase in the thin film) a temperature, which is near room temperature for this particular Ba/Sr ratio, can be found where a device based on a bomb annealed thin film would be superior for a device application compared to an as-deposited film and a $\leq 900°$ C. annealed film. The bomb annealed films have first higher dielectric constants which results in a large electric field effect and they have secondly a relatively low dielectric loss so that a device made with this material will have better properties.

The first multicomponent material which makes up the film can be made of many different materials. It can be crystalline or amorphous. It can be inorganic and include such materials as a ferroelectric material, a semiconductor or a ceramic where the ceramic can be an oxide or a nitride. Examples include $(Ba,Sr)TiO_3$, $K(Ta,Nb)O_3$, $(Sr,Ba)Nb_{10}O_{30}$, $(La,Ca)MnO_3$ and $Pb(Zr,Ti)O_3$. Preferred materials include $Ba_xSr_{1-x}TiO_3$ and $KTa_xNb_{1-x}O_3$, wherein x from 0 to 1, inclusive or where x is between 0 and 1. The film on the substrate can preferably have a thickness of about 100 angstroms to about 100 $\mu m$.

The second multicomponent material making up the vessel can be the same type of material as the first component. Again, examples include a dielectric or a superconductor. It can be crystalline or amorphous. It can have the same composition and stoichiometry as the first multicomponent film. Alternatively, it can have the identical components as the first multicomponent film, but further have at least one of the components present in an amount which is superstoichiometric with respect to the first composition. In the case where the first multicomponent has nonvolatile components, then the second can have the identical volatile components as the first multicomponent film.

The substrate can also be any type of material such as a semiconductor, an insulator, or a metal, and it can be amorphous or crystalline.

The annealing can be done at a temperature of from about 800° C. to a temperature below the melting temperature of the first multicomponent material. The substrate with the film to be annealed can either be placed in an airtight cavity in the annealing vessel or in a non-airtight cavity within the vessel. The vessel can be is surrounded by platinum such as in a platinum foil during the annealing.

The annealing can be performed at a temperature of from about 30% of the melting temperature of the first multicomponent material up to the melting temperature of the first multicomponent material. In terms of the substrate, it is preferred that the annealing be performed at a temperature below the melting temperature of the substrate and below a temperature at which the first multicomponent material reacts with the substrate.

The substrate with its film to be annealed can be completely enclosed with the vessel during the annealing. One way to enclose the substrate is to lay the substrate within a pocket formed in a first portion of the vessel so as to leave at least a portion of a surface of the substrate having the film thereon exposed and to then place a second portion of the vessel over the first portion of said vessel so as to surround the substrate having the film thereon. The second portion of said vessel can include includes a pocket which, when the vessel surrounds the substrate, the pocket of the second portion of the vessel registers with the pocket of the first portion of the vessel to form a cavity housing the substrate. The cavity can have a volume of no greater than 200 percent of the volume of the substrate having the film thereon and a preferred embodiment is to have the cavity with a volume about equal to that of the substrate having the film thereon.

The annealing can be performed with a reactive atmosphere or a non-reactive atmosphere. Examples of such atmospheres are oxidizing or reducing and can include nitrogen, oxygen, hydrogen, rare gas, or a mixture thereof, or is a mixture comprising nitrogen, oxygen, hydrogen, or a rare gas.

The annealing can be conducted under conditions so that the average grain size is increased by at least 3 times that of the starting grain size. A more preferred condition is to increases the average grain size by at least 3.5 times or even 4 times that of the starting grain size.

The annealed films produced by this method can be used for devices which reduce electrical losses at microwave and millimeter wave frequencies in the dielectric film.

It is understood that the foregoing detailed description is given merely by way of illustration and that many variations may be made therein without departing from the spirit of this invention.

What is claimed is:

1. A method of annealing a multicomponent film on a substrate, comprising the steps of:
    enclosing a substrate having a multicomponent film thereon within a vessel, said multicomponent film being formed of a first multicomponent material, said vessel being formed of a second multicomponent material, said second multicomponent material comprising at least all volatile components of said first multicomponent material; and
    annealing said multicomponent film within said vessel for a time sufficient to anneal said multicomponent film; and
    wherein said vessel is formed of said second multicomponent material such that, during said step of annealing at said temperature, said multicomponent film remains in contact with a vapor of said first multicomponent material and said second multicomponent material, said vapor preventing said multicomponent film from losing components of said first multicomponent material during said step of annealing.

2. The method of claim 1, wherein said first multicomponent material is crystalline.

3. The method of claim 2, wherein said multicomponent film is selected from the group consisting of $Ba_xSr_{1-x}TiO_3$ and $KTa_xNb_{1-x}O_3$, wherein x is from 0 to 1, inclusive.

4. The method of claim 3, wherein x is between 0 and 1.

5. The method of claim 2, wherein said multicomponent film is selected from the group consisting of $(Ba,Sr)TiO_3$, $K(Ta,Nb)O_3$, $(Sr,Ba)Nb_{10}O_{30}$, $(La,Ca)MnO_3$ and $Pb(Zr,Ti)O_3$.

6. The method of claim 1, wherein said annealing is performed at a temperature of from about 800° C. to a temperature below the melting temperature of said first multicomponent material.

7. The method of claim 1, wherein during said annealing, said substrate having said film thereon is housed in an airtight cavity in said vessel.

8. The method of claim 1, wherein said substrate having said film thereon is housed in a non-airtight cavity within said vessel.

9. The method of claim 7, wherein said vessel is surrounded by platinum during said annealing.

10. The method of claim 1, wherein said first multicomponent material is inorganic.

11. The method of claim 1, wherein said first multicomponent material is a ferroelectric material, a semiconductor or a ceramic.

12. The method of claim 11, wherein said ceramic is an oxide or a nitride.

13. The method of claim 1, wherein said second multicomponent material is a dielectric or a superconductor.

14. The method of claim 1, wherein said second multicomponent material is crystalline or amorphous.

15. The method of claim 1, wherein said second multicomponent material has the same composition and stoichiometry as said first multicomponent material.

16. The method of claim 1, wherein said second multicomponent material has the identical components as said first multicomponent material but has at least one of said components present in an amount which is superstoichiometric with respect to said first multicomponent material.

17. The method of claim 1, wherein said second multicomponent material has the identical volatile components as said first multicomponent material.

18. The method of claim 1, wherein said film has a thickness of about 100 angstroms to 100 $\mu$m.

19. The method of claim 1, wherein said annealing is performed at a temperature of from about 30% of the melting temperature of said first multicomponent material up to the melting temperature of said first multicomponent material.

20. The method of claim 19, wherein said annealing is performed at a temperature below a melting temperature of the substrate and below a temperature at which said first multicomponent material reacts with said substrate.

21. The method of claim 1, wherein said substrate is a semiconductor, insulator, or a metal, and is amorphous or crystalline.

22. The method of claim 1, wherein said substrate is completely enclosed with said vessel during said annealing.

23. The method of claim 22, wherein the enclosing of said substrate within said vessel comprises:
    laying said substrate within a pocket formed in a first portion of said vessel so as to leave at least a portion of a surface of said substrate, with said film thereon, exposed; and
    placing a second portion of said vessel over said first portion of said vessel so as to surround said substrate having said film thereon.

24. The method of claim 23, wherein said second portion of said vessel includes a pocket that, when said vessel surrounds said substrate, the pocket of said second vessel registers with the pocket of said first vessel to form a cavity housing said substrate.

25. The method of claim 24, wherein said cavity has a volume of no greater than 200 percent of the volume of said substrate having said film thereon.

26. The method of claim 25, wherein said cavity has a volume about equal to that of said substrate having said film thereon.

27. The method of claim 1, wherein said annealing is performed within a reactive atmosphere or a non-reactive atmosphere.

28. The method of claim 23, wherein said atmosphere is oxidizing or reducing.

29. The method of claim 27, wherein said atmosphere consists of nitrogen, oxygen, hydrogen, rare gas, or a mixture thereof, or is a mixture comprising nitrogen, oxygen, hydrogen, or a rare gas.

30. A method of reducing electrical losses at microwave and millimeter wave frequencies in a dielectric firm, comprising the steps of:

enclosing a substrate having a multicomponent film thereon within a vessel, said multicomponent film being formed of a first multicomponent material, said vessel being formed of a second multicomponent material, said second multicomponent material comprising at least all volatile components of said first multicomponent material; and annealing said multicomponent film within said vessel for a time sufficient to anneal said multicomponent film;

wherein said vessel is formed of said second multicomponent material such that, during said step of annealing at said temperature, said multicomponent film remains in contact with a vapor of said first multicomponent material and said second multicomponent material, said vapor preventing said multicomponent film from losing components of said first multicomponent material during said step of annealing; and wherein said film is a dielectric film.

31. The method of claim 30, wherein said dielectric film has a thickness of about 100 angstroms to 100 $\mu$m.

32. The method of claim 1, wherein said annealing step increases the average grain size by at least 3 times that of a starting grain size prior to said anneal step.

33. The method of claim 32, wherein said annealing increases the average grain size by at least 3.5 times that of the starting grain size.

34. The method of claim 33, wherein said annealing increases the average grain size by at least 4 times that of the starting grain size.

* * * * *